United States Patent [19]

Bovée et al.

[11] Patent Number: 5,081,417
[45] Date of Patent: Jan. 14, 1992

[54] 2-QUANTUM SELECTIVE MR SEQUENCE FOR SELECTIVELY DETERMINING A NUCLEAR MAGNETISATION DISTRIBUTION OF A METABOLITE

[75] Inventors: Willem M. M. J. Bovée, Maassluis; Johannes E. Van Dijk, Delft, both of Netherlands

[73] Assignee: U.S. Philips Corporation, New York, N.Y.

[21] Appl. No.: 526,404

[22] Filed: May 18, 1990

[30] Foreign Application Priority Data

Aug. 4, 1989 [NL] Netherlands ............. 8902003

[51] Int. Cl.$^5$ ................. G01R 33/20
[52] U.S. Cl. ................... 324/307
[58] Field of Search ............. 324/300, 307, 309, 310, 324/311, 312, 313, 314, 318, 322

[56] References Cited

U.S. PATENT DOCUMENTS

| | | | |
|---|---|---|---|
| 4,626,783 | 12/1986 | Ohuchi | 324/307 |
| 4,680,546 | 7/1987 | Dumoulin | 324/307 |
| 4,703,270 | 10/1987 | Hall et al. | 324/309 |
| 4,843,321 | 6/1989 | Sotak | 324/309 |
| 4,962,357 | 10/1990 | Sotak | 324/309 |

OTHER PUBLICATIONS

Chemical Physics Letters, 1 Feb. 1980, pp. 567-570, by A. Bax et al, "Separation of the Different Orders of NMR Multiple-Quantum Transitions by the use of Pulse Field Gradients".

*Primary Examiner*—Michael J. Tokar
*Attorney, Agent, or Firm*—William Squire

[57] ABSTRACT

A 2-quantum selective MR sequence is proposed for the selective determination of the nuclear magnetisation distribution of a metabolite such as lacate while suppressing at the same time another metabolite such as alanine. A 2-quantum selective sequence which contains three 90° pulses (p1, p2, p3) and two gradients (G1r, G2r) for the selection of 2-quantum coherence is performed twice, the polarity of one of the two gradients (G1r, G1r') being reversed. When the time interval (tb) between the second (p2) and the third (p3) pulse is suitably chosen, a spectrum of a metabolite such as lactate is selectively determined from the amplitude modulated sum signal of the resonance signals generated by the sequence.

15 Claims, 1 Drawing Sheet

2-QUANTUM SELECTIVE MR SEQUENCE FOR SELECTIVELY DETERMINING A NUCLEAR MAGNETISATION DISTRIBUTION OF A METABOLITE

The invention relates to a method for selectively determining a nuclear magnetisation distribution of a part of an object arranged in a steady, uniform magnetic field, resonance signals being generated by means of a 2-quantum selective sequence which comprises at least three rf pulses and two gradient magnetic fields which are superposed on the steady magnetic field in order to select 2-quantum coherence generated by the rf pulses.

Figure 2:
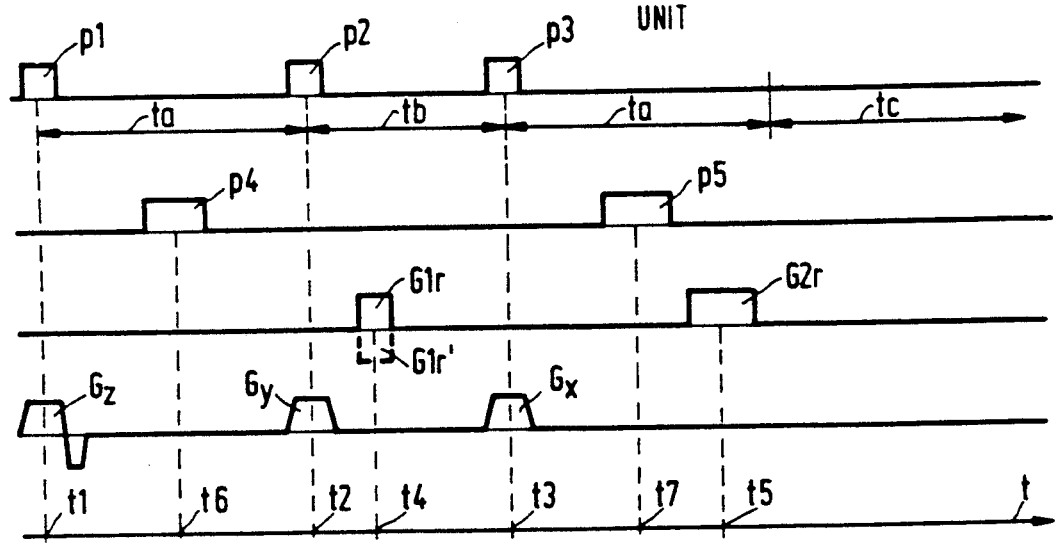

A method of this kind is described in an article "Separation of the different orders of NMR multiple-quantum transitions by the use of pulsed field gradients", A. Bax et al., Chemical Physics Letters, Vol. 69, No. 3, 1 Feb. 1980, pp. 567–570. FIG. 2 ($d$) on page 569 of the cited article shows a pulse and gradient sequence inter alia for making only 2-quantum coherence visible in a multiple quantum experiment. The sequence comprises three rf electromagnetic 90° pulses for rotating a magnetisation vector through 90° in an xyz coordinate system. In order to make only the 2-quantum coherence visible, on both sides of the third 90° pulse a gradient magnetic field is superposed on a steady magnetic field so that the surface area of the gradient pulse after the third 90° pulse is twice as large as the surface area of the gradient pulse preceding the third 90° pulse. For a theoretical deliberation reference is made to the article. A 2D-spectrum is determined from resonance signals obtained while varying inter alia a multiple quantum evolution period, that is to say the time interval between the second and the third 90° pulse. For inter alia in vivo MR measurements where it is desirable to obtain information concerning a given metabolite, a method of this kind is not very well suitable because of the total measuring time which is often long. 1D measurements could be performed, but in that case important information may be lost because often overlapping of in vivo interesting metabolites often occurs. Such overlapping occurs notably, for example in the case of coupled protons such as alanine and lactate in an object which contains non-coupled protons of water. For example, a lactate spectrum, measured in a localised manner or not, may provide important information concerning the object. For example, lactate is released by muscular work and a difference in lactate concentration may exist between healthy tissue and diseased tissue. Carcinoma may also exhibit a difference in lactate concentration after radiation and/or chemical therapy.

It is inter alia the object of the invention to provide a method for selectively discriminating metabolites in an object while reducing the total measuring time.

To achieve this, a method in accordance with the invention is characterized in that the 2-quantum selective sequence is applied at least twice, using the same time difference between the second and the third rf pulse and a different sign of one of the two gradients, the time integrals over the two gradients being equal, in order to obtain two different resonance signals which are summed in order to obtain a 2-quantum amplitude modulated signal wherefrom a signal associated with a metabolite is selected by a suitable choice of the time difference. As a result, the spectrum of a metabolite such as lactate can be measured within a comparatively short period of time. The time difference is chosen so that a 90° phase difference occurs between, for example metabolites such as alanine and lactate, in the filtered 2-quantum coherence resonance signal, so that a discrimination is possible.

It is to be noted that the use of gradients of different polarity for obtaining an echo and a so-called anti-echo is known per se from the book "Two-Dimensional Nuclear Magnetic Resonance in Liquids", A. Bax, DUP, ISBN 90-277-1412-6, 1985. This method is disclosed on page 142 of this book. This book, however, dealing with so-called high-resolution spectroscopy, does not provide any indication whatsoever as regards the combination of this echo and anti-echo for metabolite discrimination.

A version of a method in accordance with the invention is characterized in that 180° refocusing pulses are generated after the first and the third rf pulse. As a result, dephasing due to chemical shifts is eliminated and the measuring method becomes less susceptible to field inhomogeneities.

A further version of the method in accordance with the invention is characterized in that at least one of the pulses is rendered slice-selective for the selection of a sub-volume of the object. The sequence can thus be rendered volume-selective. Volume selection is known per se and described in detail in many publications. The slice-selective pulses can be combined with one or more gradients for location-dependent phase encoding. In order to avoid location-dependent dephasing of undesirable coherences, preferably the gradients used for the selection of the 2-quantum coherence are not used at the same time for localisation. The 2-quantum selective sequence may also be preceded by a known volume-selective excitation sequence.

Figure 1:
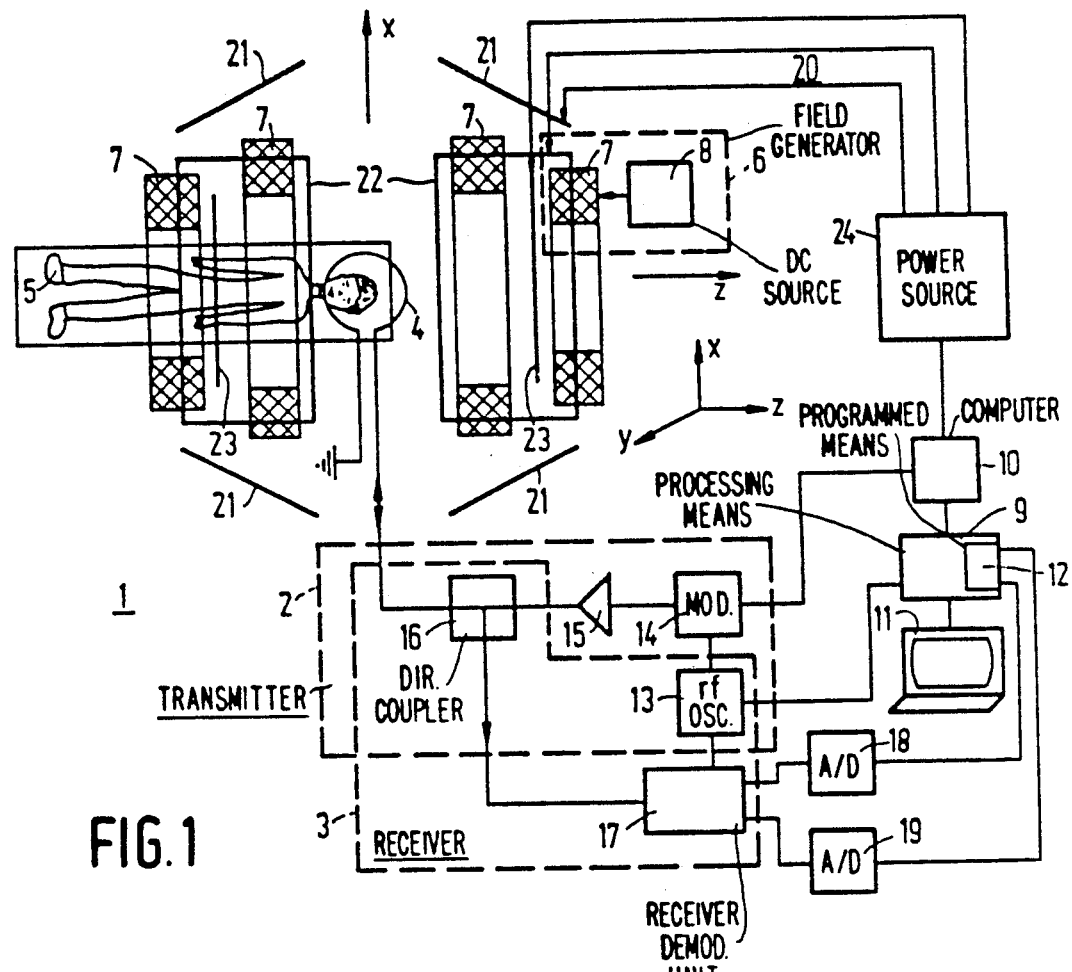

The invention will be described in detail hereinafter with reference to a drawing; therein:

FIG. 1 diagrammatically shows a device in accordance with the invention, and

FIG. 2 shows a 2-quantum selective sequence in accordance with the invention.

FIG. 1 diagrammatically shows a magnetic resonance device 1 in accordance with the invention, comprising transmitter means 2 and receiver means 3 for the transmission of rf electromagnetic pulses, via a transmitter/receiver coil 4, to an object 5 and the reception of magnetic resonance signals, respectively, which are generated in the object 5 by the rf electromagnetic pulses, the object being situated in a steady, uniform magnetic field. The device 1 comprises means 6 for generating the steady field. The means 6 comprise magnet coils 7 and, in the case of resistive magnets or superconducting magnets, a DC power supply source 8. During operation of the device 1, with the object arranged within the magnet coils 7, a slight excess of nuclear spins (of nuclei having a magnetic moment) will be oriented in the same direction as the steady magnetic field in the state of equilibrium. From a macroscopic point of view this is to be considered as a magnetisation M, being an equilibrium magnetisation. The device 1 furthermore comprises processing means which are coupled to the transmitter means 2 and the receiver means 3, a process computer 10 which is coupled to the processing means 9 and the transmitter means 2, and display means 11 for displaying a nuclear magnetisation distribution which is determined, using programmed means 12, from resonance signals received and demodulated by the receiver means 3, after signal sampling thereof (detection of resonance signals). Specifically, the transmitter means 2 comprise an rf oscillator 13 for generating a carrier signal, a modulator 14 for amplitude and/or phase or frequency modulation of the carrier signal, a power amplifier 15, and a directional coupler 16 which is coupled to the transmitter/receiver coil 4. The transmitter/receiver coil 4 may be a coil which encloses the entire object 5, or a coil which encloses a part of the object 5, or a surface coil. The rf oscillator 13 is coupled to the processing means 9 and the modulator 14 is coupled to the process computer 10. When excitation pulses having a frequency contents around the Larmor frequency of, for example protons are applied to the object 5, under the control of the programmed means 12 and via the transmitter means 2, magnetic resonance signals will be produced wherefrom a proton spectrum can be determined by means of the programmed means 12 using, for example Fourier transformation. The receiver means 3 for receiving the resonance signals comprise the directional coupler 16 and a receiver and demodulation unit 17. The unit 17 is, for example a double phase-sensitive detector whose output signals are sampled by way of a first and a second A/D converter 18, 19. The first and the second A/D converter 18 and 19 are coupled to the processing means 9. When a separate transmitter coil and receiver coil are present, the directional coupler 16 is absent. The device furthermore comprises means 20 for generating magnetic field gradients which are superposed on the steady, uniform magnetic field. The means 20 comprise gradient magnet coils 21, 22 and 23 for generating a magnetic field gradient $G_x$, $G_y$ and $G_z$, respectively, and a power supply source 24 which can be controlled by the process computer for powering the separately controllable gradient magnet coils 21, 22 and 23. In the embodiment shown the arrangement in space of the gradient magnet coils is such that the field direction of the magnetic field gradients coincides with direction of the steady, uniform magnetic field, the gradient directions extending mutually perpendicularly as denoted in FIG. 1 by way of three mutually perpendicular axes x, y and z. When pulse and gradient sequences are applied to the object 5, the resonance signals can be used inter alia for spectroscopy, location-dependent spectroscopy and spectroscopic imaging. For in vivo cranial spectroscopy use can be made of a so-called head coil, and for other parts a surface coil can be used.

FIG. 2 shows a 2-quantum selective sequence in accordance with the invention as a function of time t, the references t1 to t7 denoting a number of instants. The sequence in accordance with the invention is adapted to discriminate 2-quantum selected metabolites exhibiting a weak J-coupling and overlap in the frequency spectrum, for example the discrimination of coupled protons of lactate and alanine. In vivo these substances will be present in an environment of non-coupled protons of water and also of given fats. Lactate contains CH-groups and $CH_3$-groups at different positions within the molecule. Due to a different chemical environment, the CH-groups effectively experience a magnetic field other than that experienced by the $CH_3$-groups, which becomes manifest as a different chemical shift. A proton in a $CH_3$-group is weakly coupled to a proton in a CH-group and "sees" a spin up and a spin down, so that a proton in a $CH_3$-group may have respective resonant frequencies $\omega_0 \pm \pi J$, where $\omega_0$ is the Larmor frequency of protons in water. In the spectrum the $CH_3$-group of lactate exhibits a doublet. The situation is more complex as regards the CH-group, because in the spectrum a quartet is formed because of the larger number of couplings. Alanine also exhibits weak J-coupling. The coupling constant J is substantially the same for lactate and alanine. Various spectral peaks of lactate and alanine overlap. In accordance with the invention the J-coupling is used to discriminate molecules as being lactate and alanine. For coupled protons multiple quantum coherences can be generated where a 1-quantum coherence can be observed and 0-quantum or 2-quantum coherence cannot be observed. 1-coherence remains for non-coupled spins. Under the control of the programmed means 12, at the instant $t=t1$ an rf electromagnetic 90° pulse p1 is generated which rotates (orients in the transverse direction) an equilibrium magnetisation in the object 5 through 90° in a coordinate system x'y'z' which rotates at the Larmor frequency of water. It is assumed that the z' axis coincides with the z axis of the stationary xyz coordinate system, so that the equilibrium magnetisation is oriented along the z axis (longitudinally). The pulse p1 causes 1-quantum coherences. At the instant $t=t2$ an rf electromagnetic 90° pulse p2 is generated. In the case of weakly coupled spins, 0-quantum or 2-quantum coherences can then be produced or even higher quantum coherences. Only the 1-quantum coherence can be observed. In the time interval ta between the instants $t=t1$ and $t=t2$ the spin system is conditioned. After the instant $t=t2$, the spin system evolves in the time interval tb until the instant $t=t3$ is reached. At the instant $t=t3$ a third rf pulse p3 is generated whereby 0-quantum and 2-quantum coherences can be made observable in the form of 1-quantum coherence. In the time interval tc resonance signals are received by the receiver means 3. After sampling of the resonance signals, the processing means 9 determine a selective spectrum in a manner in accordance with the invention which is yet to be described, localised or not. In order to filter out only the 2-quantum coherence, at the instants $t=t4$ and $t=t5$ respective field gradients G1r and G2r ($r=x$, y or z) are respectively applied between the pulses p2 and p3 and after the pulse p3, the gradient pulse G2r having a surface area which is twice as large as that of the gradient pulse G1r. In order to obtain an optimum signal, 180° refocusing pulses p4 and p5 are respectively generated between the pulses p1 and p2 and after the pulse p3. The sequence described thus far is known. For a further description reference is made to the article by Bax and also to an article by Sotak et al, JMR 78, pp. 355-361 (1988). It is also to be noted that molecules such as lactate and alanine can be discriminated on the basis of the difference in 2-quantum frequency. 2-Quantum coherence in a coupled spin system evolves with the sum of the chemical shifts in the system. In accordance with the invention each time two resonance signals generated by the sequence are combined, the sign of the gradient pulse G1r or G2r being reversed in respective sequences; for example, a first sequence is generated with gradient pulses G1r and G2r and a second sequence with gradient pulses G1r' and G2r, G1r' having a polarity which deviates from that of G1r. In given example the time integrals over the respective gradients G1r and G1r' are equal. The gradients G1r and G1r' may have equal amplitudes. The 2-quantum filtered out resonance signals are summed. By choosing a suitable duration for the time interval tb, either the filtered-out 2-quantum signal originating from alanine or the filtered-out 2-quantum signal originating from lactate is suppressed. Based on a sequence as shown in FIG. 2, including pulses p1 to p5 and gradients G1r (G1r') and G2r, it can be demonstrated that one sequence produces transverse magnetisation components $M_x$ and $M_y$:

$$M_x \sim \sin \omega_{2q}\text{tb} \text{ and } M_y \sim \cos \omega_{2q}\text{tb}$$

the other sequence producing transverse magnetisation components $M_x$ and $M_y$:

$$M_x \sim -\sin \omega_{2q}\text{tb} \text{ and } M_y \sim \cos \omega_{2q}\text{tb}$$

where $\omega_{2q}$ is a 2-quantum frequency. In accordance with the invention, the respective signals are summed, so that only cos terms remain, i.e.

$$M_y \sim \cos \omega_{2q}\text{tb}.$$

For example, when lactate and alanine are present, $M_y$ is an amplitude-modulated signal of cos terms, because $\omega_{2q}$ differs for lactate and alanine. Lactate is selectively measured by choosing tb so that:

$$|\cos \omega_{2qA}\cdot\text{tb}| = 0 \text{ and } |\cos \omega_{2qL}\cdot\text{tb}| = 1,$$

where $\omega_{2qA}$ is the 2-quantum frequency of alanine and $\omega_{2qL}$ is the 2-quantum frequency of lactate. Alanine is selectively measured by choosing tb so that:

$$|\cos \omega_{2qA}\cdot\text{tb}| = 1 \text{ and } |\cos \omega_{2qL}\cdot\text{tb}| = 0.$$

The evolution interval tb is the same for the two sequences.

It is to be noted that the method can also be used for pulse angles smaller than 90° and that the 180° refocusing pulses may be omitted. In that case the signal obtained is not optimum. The time interval ta may be chosen to equal 1/(2J). In practice this will amount to some tens of ms, so that signal reduction occurs due to relaxation. In order to obtain an optimum signal, in practice a value smaller than 1/(2J) will be chosen for ta. Furthermore, the choice of tb is not very critical. In order to achieve an acceptable signal-to-noise ratio, in practice it will usually be necessary to repeat the sequence and to apply signal averaging. In order to enable localised use of the sequence, for example the 90° pulses can be rendered slice-selective by means of gradients $G_z$, $G_y$ and $G_x$ as shown in FIG. 2. Alternatively, the sequence may be preceded by a volume-selective excitation sequence, for example as described in JMR 56, pp. 350–354 (1984) in an article by Aue et al. For spectroscopic imaging the sequence can be extended so as to include phase encoding gradients in known manner.

What is claimed is:

1. A method for selectively determining a nuclear magnetisation distribution of a part of an object arranged in a steady, uniform magnetic field, resonance signals being generated by means of a 2-quantum selective sequence which comprises at least three rf pulses and two gradient magnetic fields which are superposed on the steady magnetic field in order to select 2-quantum coherence generated by the rf pulses, characterized in applying the 2-quantum selective sequence at least twice, using the same time difference between the second and the third rf pulses and a different sign of one of the two gradients, the time integrals over the two gradients being equal, in order to obtain two different resonance signals, summing the two resonance signals to obtain a 2-quantum amplitude modulated signal and selecting a signal associated with a metabolite by choosing a time difference.

2. A method as claimed in claim 1, where the object contains coupled protons of alanine and lactate and non-coupled protons of water, characterized in that the time difference is chosen so that the selected metabolite is lactate.

3. A method as claimed in claim 1, where the object contains coupled protons of alanine and lactate and non-coupled protons of water, characterized in that the time difference is chosen so that the selected metabolite is alanine.

4. A method as claimed in claim 1, characterized in that the rf pulses are 90° pulses.

5. A method as claimed in claim 1, characterized in that 180° refocusing pulses are generated after the first and the third rf pulse.

6. A method as claimed in claim 1, characterized in that at least one of the pulses is rendered slice-selective for the selection of a sub-volume of the object.

7. A method as claimed in claim 2, characterized in that the rf pulses are 90° pulses.

8. A method as claimed in claim 3, characterized in that the rf pulses are 90° pulses.

9. A method as claimed in claim 2, characterized in that 180° refocusing pulses are generated after the first and the third rf pulse.

10. A method as claimed in claim 3, characterized in that 180° refocusing pulses are generated after the first and the third rf pulse.

11. A method as claimed in claim 4, characterized in that 180° refocusing pulses are generated after the first and the third rf pulse.

12. A method as claimed in claim 2, characterized in that at least one of the pulses is rendered slice-selective for the selection of a sub-volume of the object.

13. A method as claimed in claim 3, characterized in that at least one of the pulses is rendered slice-selective for the selection of a sub-volume of the object.

14. A method as claimed in claim 4, characterized in that at least one of the pulses is rendered slice-selective for the selection of a sub-volume of the object.

15. A method as claimed in claim 5, characterized in that at least one of the pulses is rendered slice-selective for the selection of a sub-volume of the object.

* * * * *